United States Patent [19]

Schmitt et al.

[11] Patent Number: 5,138,259

[45] Date of Patent: Aug. 11, 1992

[54] METHOD FOR SUPPRESSING IMAGE ARTIFACTS IN A MAGNETIC RESONANCE IMAGING APPARATUS

[75] Inventors: Franz Schmitt, Erlangen; Georg Goertler, Buckenhof, both of Fed. Rep. of Germany

[73] Assignee: Siemens Aktiengesellschaft, Munich, Fed. Rep. of Germany

[21] Appl. No.: 653,510

[22] Filed: Feb. 11, 1991

[30] Foreign Application Priority Data

Feb. 22, 1990 [DE] Fed. Rep. of Germany ....... 4005675

[51] Int. Cl.$^5$ ........................................... G01R 33/20
[52] U.S. Cl. ..................................................... 324/309
[58] Field of Search ............... 324/300, 307, 309, 310, 324/311, 312, 313, 314, 318, 322; 128/653 A

[56] References Cited

U.S. PATENT DOCUMENTS

| | | | |
|---|---|---|---|
| 4,516,075 | 5/1985 | Moran | 324/309 |
| 4,609,872 | 9/1986 | O'Donnell | 324/306 |
| 4,625,170 | 11/1986 | Yamamoto et al. | 324/309 |
| 4,684,890 | 8/1987 | Briquet et al. | 324/309 |
| 4,684,891 | 8/1987 | Feinberg | 324/309 |
| 4,697,149 | 9/1987 | Moran | 324/309 |
| 4,707,661 | 11/1987 | Hoenninger, III | 324/309 |
| 4,710,717 | 12/1987 | Pelc et al. | 324/309 |
| 4,713,614 | 12/1987 | Hoshino et al. | 324/307 |
| 4,721,911 | 1/1988 | Neumann | 324/309 |
| 4,862,081 | 8/1989 | Denison | 324/307 |
| 4,959,611 | 9/1990 | Brovost et al. | 324/309 |
| 5,055,790 | 10/1991 | Siuciak et al. | 324/309 |

FOREIGN PATENT DOCUMENTS

| | | |
|---|---|---|
| 0145277 | 6/1985 | European Pat. Off. . |
| 0205199 | 5/1987 | European Pat. Off. . |
| 0223279 | 5/1987 | European Pat. Off. . |
| 0265956 | 5/1988 | European Pat. Off. . |
| 0337588 | 10/1989 | European Pat. Off. . |
| 2755956 | 6/1978 | Fed. Rep. of Germany . |
| 3436363 | 5/1985 | Fed. Rep. of Germany . |
| 3636251 | 7/1987 | Fed. Rep. of Germany . |
| 3728797 | 3/1988 | Fed. Rep. of Germany . |
| 3825698 | 2/1989 | Fed. Rep. of Germany . |
| 3917309 | 12/1989 | Fed. Rep. of Germany . |
| 2056078 | 3/1981 | United Kingdom . |

OTHER PUBLICATIONS

"Correcting Artifacts in Magnetic Resonance Imaging Due to Magnetic Fields Caused by Slowly Oscillating Shields" IBM Technical Disclosure Bulletin, vol. 31, No. 8, Jan. 1989 (pp. 120-121).

Primary Examiner—Michael J. Tokar

[57] ABSTRACT

A method for suppressing image artifacts in a magnetic resonance imaging apparatus includes conducting an adjustment scan of the examination subject preceding or following the scan or scans which are used to acquire the measured data. The adjustment scan differs from measuring scan in that it is implemented without the generation of a phase-coding gradient. The data acquired in the adjustment scan are interpreted to identify any inadequacies in the generation of the raw data, and correction data are calculated. Using the correction data, the raw data sets which are Fourier-transformed in the read-out direction, are then corrected. N/2 ghosts can thus be suppressed, and the influence of inhomogeneities in the static field can be reduced.

6 Claims, 4 Drawing Sheets

METHOD FOR SUPPRESSING IMAGE ARTIFACTS IN A MAGNETIC RESONANCE IMAGING APPARATUS

BACKGROUND OF THE INVENTION

1. Field of the Invention

The present invention is directed to a method for suppressing image artifacts in a magnetic resonance imaging apparatus (MRI, or NMR (nuclear magnetic resonance)).

2. Description of the Prior Art

In a magnetic resonance imaging apparatus, at least one region of an examination subject is charged with RF pulses during a measuring scan. The examination subject is disposed in a fundamental or static magnetic field for acquiring the measured data. A phase-coding gradient and a read-out gradient are subsequently generated, with the resulting magnetic resonance signal occurring under each pulse of the read-out gradient being sampled. The samples acquired in this manner for each pulse of the read-out gradient are entered in a row of a raw data matrix. The direction of the data entry in the matrix corresponds to the polarity of the pulses of the read-out gradient. The raw data matrix is subjected to a two-dimensional Fourier transformation for acquiring an image matrix. An image of the examination subject is acquired from the image matrix.

The measuring or processing conditions for the measured signals change from scan to scan, i.e., from row to row of the raw data matrix, when imaging with specific pulse sequences. This occurs, for example, in the echo planar method as disclosed in German OS 27 55 956 and in the RARE method, described in the periodical "Magnetic Resonance Imaging," Vol. 6, pp. 391–395 (1988). If only slight deviations occur from row to row, this results in an image artifact known as "N/2 ghosts" which means that in an image matrix of $N \times N$ points, the actual image is seen again shifted by N/2 points in the positive and negative directions with respect to the middle of the image matrix, generally with a different intensity from the primary image. Further, inhomogeneities in the static field and non-linearities of the gradient fields can cause image distortions.

SUMMARY OF THE INVENTION

It is an object of the present invention to provide a method in the form of a pulse sequence, or a series of pulse sequences, which reduces image artifacts in the generation of an image in a magnetic resonance imaging apparatus.

The above object is achieved in accordance with the principles of the present invention in a method wherein an adjustment scan is undertaken which either precedes or follows the measured data acquisition. The adjustment scan differs from the measurement scan in that the adjustment scan is implemented without the generation of a phase-coding gradient. The data acquired in the adjustment scan are entered into an adjustment data matrix, and are interpreted to identify any inadequacies in the generation of the raw data. Correction data are thereby calculated.

The correction data are applied to the raw data sets, which are Fourier transformed in the read-out direction using the correction data. Image artifacts, such as N/2 ghosts, are thereby suppressed, as are artifacts which are due to inhomogeneities in the static field.

An embodiment of the method is disclosed wherein a linear phase correction is implemented, and another embodiment is also disclosed wherein phase errors of a higher order are also taken into consideration.

DESCRIPTION OF THE PREFERRED EMBODIMENTS

Figure 1:
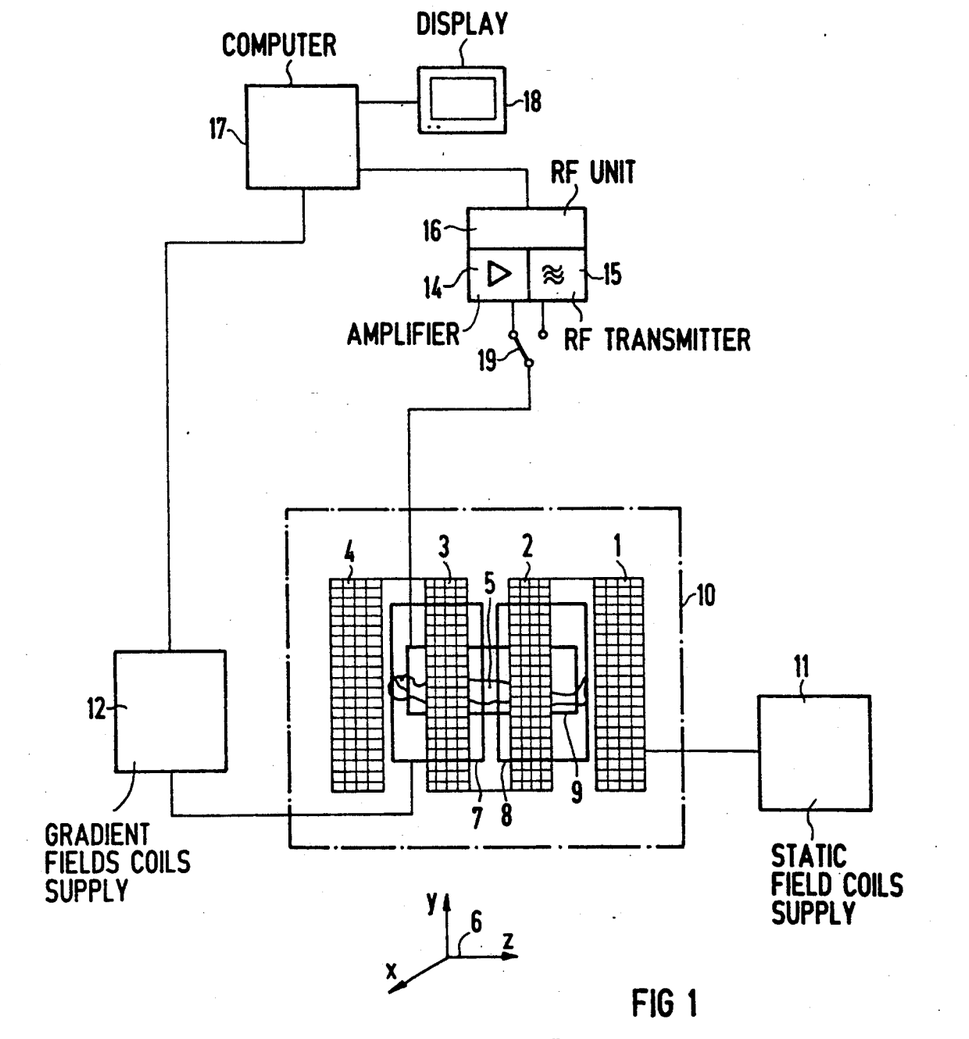
FIG. 1 is a schematic block diagram of a conventional magnetic resonance imaging apparatus of the type which can be used to practice the method disclosed herein.

The basic components of a conventional magnetic resonance imaging tomography apparatus are shown in FIG. 1. Coils 1, 2, 3 and 4 generate a fundamental or static magnetic field $B_0$, in which the body 5 of a patient to be examined is situated, if the apparatus is used for medical diagnostics. Sets of gradient coils are provided for respectively generating independent, orthogonal magnetic field components in the x, y and z directions of the Cartesian coordinate system 6. For clarity, only the gradient coils 7 and 8 are shown in FIG. 1, which generate an x-gradient in combination with a pair of identical gradient coils disposed on the opposite side of the body 5. A set of y-gradient coils (not shown) are disposed parallel to the body 5 above and below the body 5. A set of z-gradient coils (not shown) are disposed transversely relative to the longitudinal axis of the body 5, at the head and feet of the body 5.

The apparatus also includes a radio-frequency coil 9 which generates and registers the nuclear magnetic resonance signals. The coils 1, 2, 3, 4, 7, 8 and 9 surrounded by the dot-dash line 10 represent the actual examination instrument.

The examination instrument is operated by an electrical arrangement which includes a static field coil power supply 11 for driving the coils 1–4, and a gradient fields coils power supply 12 to which the gradient coils 7 and 8 and the further gradient coils are connected. The radio frequency coil 9 is connected via switch 19 to a radio frequency unit 16. In the signal transmission mode, the radio frequency coil 9 is connected via the switch 19 to a radio frequency transmitter 15, and in the reception mode, the radio frequency coil 9 is connected to an amplifier 14 and the transmitter 15 are connected to a process control computer 17 which controls operation of the RF unit 16 and the gradient fields coils supply 12, and which also constructs the image to be displayed from the acquired data. The image is displayed on a display 18 connected to the computer 17.

A number of pulse sequences are known for driving the radio frequency unit 16 and the gradient coils. Methods have prevailed wherein the image generation is based on a two-dimensional or three-dimensional Fourier transformation of the acquired measured values.

N/2 ghosts constitute a problem in the generation of an artifact-free image, particularly given pulse sequences having read-out gradients with alternating polarity. The nature of this problem is set forth below using the echo planar imaging (EPI) sequence as an example.

Figure 2:
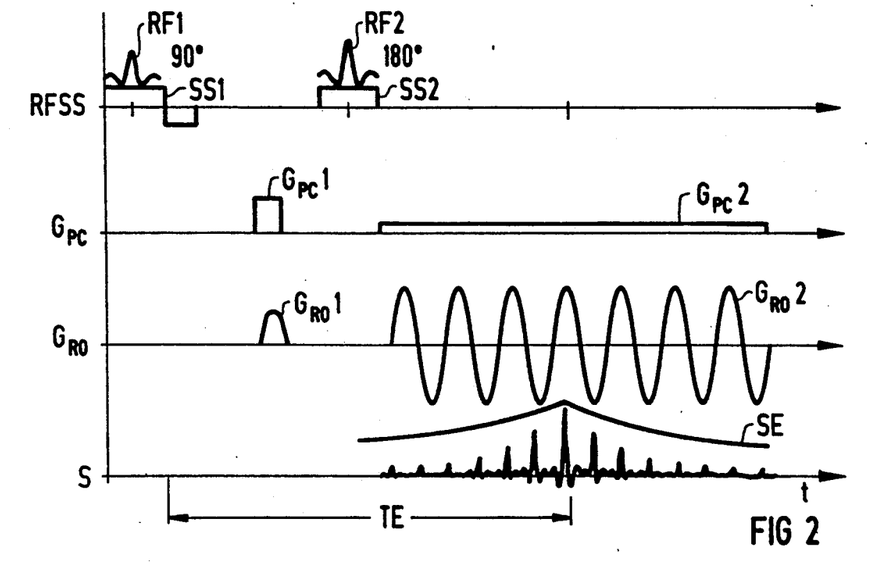
FIG. 2 shows the various signals which are generated during conventional operation of the apparatus shown in FIG. 1.

The basic signals generated in the EPI method are shown in the pulse diagrams of FIG. 2. A more detailed description of the EPI method may be found in the aforementioned German OS 27 55 956.

In the presence of a slice selection gradient SS1, a 90° RF pulse RF1 is generated, which only excites a selected slice of the examination subject as a consequence of the presence of the slice selection gradient SS1.

After the excitation, a pre-phasing gradient $G_{RC}1$ in the phase-coding direction and a gradient $G_{RO}1$ in the read-out direction are generated. These are followed by a 180° RF pulse RF2, which again only excites the selected slice of the examination subject, due to a simultaneously generated slice selection gradient SS2.

A read-out gradient $G_{RO}2$ is generated, which consists of a plurality of individual pulses of alternating polarity. Due to the alternating polarity, the resulting nuclear magnetic resonance signal is alternatingly dephased and again re-phased, so that the signal curve S shown in FIG. 2 occurs. The signal S arises under the envelope of a spin echo SE, having an echo time TE following the excitation by the 90° RF pulse RF1. The raw data matrix M can be considered as a measured data space, which is a measured data plane in the two-dimensional case shown in the exemplary embodiment. This measured data space is generally referred to as "k space" in magnetic resonance imaging tomography.

It will be understood that instead of using a sinusoidal curve as the gradient $G_{RO}2$ as shown in FIG. 2, this gradient may have a rectangular shape.

During the read-out phase, further, a phase-coding gradient $G_{PC}2$ is generated in the phase-coding direction with constant polarity. Instead of the continuous phase-coding gradients $G_{PC}1$ and $G_{PC}2$ shown in FIG. 2, individual pulses could be used before the individual pulses of the read-out gradient $G_{RO}2$. Given this pulse sequence, the read-out gradient $G_{RO}2$ effects a frequency coding of the signal S in the read-out direction. The phase-coding gradient $G_{PC}$ effects a phase coding in the phase-coding direction, with the time integral of the gradient $G_{PC}$ being the determining factor for the phase relation of the nuclear magnetic spins.

The read-out gradients $G_{RO}$, the phase-coding gradients $G_{PC}$ and the slice selection gradients $G_{SS}$ are disposed perpendicularly relative to each other, for example in the respective x, y and z directions of the Cartesian coordinate system 6.

The information regarding the spatial origin of the signal contributions S, needed for image generation, is coded in the phase factors, whereas the relationship between the locus space (i.e., the image) and the k space exists mathematically via a two-dimensional Fourier transformation. This is accomplished using the following relationships:

$$S(K_x,K_y) = \int\int \rho(x,y)\exp(i(k_x x + k_y y))dxdy.$$

In the above equation, the following definitions are applicable:

$$k_x(t) = \gamma \int_0^t G_x(t')dt'; \text{ and}$$

$$k_y(t) = \gamma \int_0^t G_y(t')dt';$$

wherein $\gamma$ is the gyromagnetic ratio, $G_x(t')$ is the momentary value of the read-out gradient $G_{RO}$ and $G_y(t')$ is the momentary value of the phase-coding gradient $G_{PC}$.

It is assumed that the read-out gradient $G_{RO}$ is in the x-direction and the phase-coding gradient $G_{PC}$ is in the y-direction of the Cartesian coordinate system 6.

The signal S is measured as a complex quantity by phase-sensitive demodulation. The analog signal acquired in this manner is sampled in a time grid, the samples are digitized, and are entered into a row of the raw data matrix M shown in FIG. 3 per individual pulse of the read-out gradient $G_{RO}$. N complex values are read-out under each individual pulse (half-wave) of the read-out gradient $G_{RO}$. These are entered into a row of the raw data matrix S(i,j), wherein i is the row index and j is the column index. N individual pulses of the read-out gradient $G_{RO}$ follow after excitation, so that the matrix M contains N rows. The matrix M is thus an N×N matrix.

Figure 3:
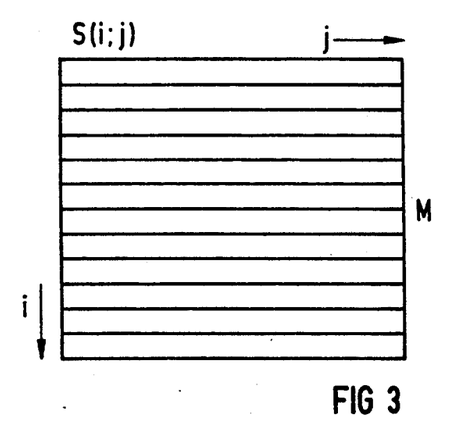
FIG. 3 is a schematic representation of a raw data matrix in which the data acquired in the apparatus operated according to the signals shown in FIG. 2 are stored.

Because the polarity of the gradient $G_{RO}$ alternates, the measured values are correspondingly entered in alternation into the raw data matrix M, first with incrementing j (column index) values, and then with decrementing j-values in the following row.

An image can be calculated from the raw data matrix M using two-dimensional Fourier transformation. The method usually employed for this calculation is explained in detail in German OS 28 55 956.

Figure 4:
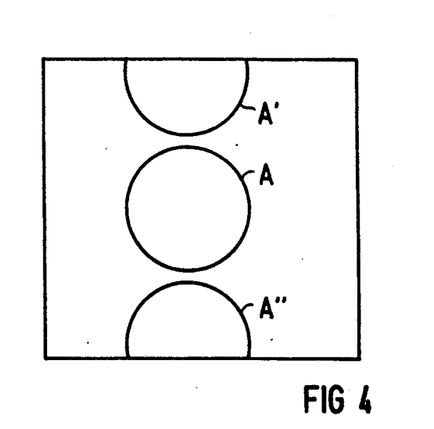
FIG. 4 is a schematic representation of an image generated using the signals shown in FIG. 2 which exhibits N/2 ghosts.

The following problem arises in the standard type of Fourier transformation. In order to take the different gradient directions during read-out of the signal S into consideration, the data entry directions, as described above, must be alternated in every row of the raw data matrix. This leads to a susceptibility to N/2 ghosts. This is shown in FIG. 4. A subject for which an image is to be generated, for example a circle A in the N×N image matrix, is imaged again at A' and A" shifted N/2 points in the positive and negative directions with respect to the middle of the image matrix. These "ghost images"

overlap the primary image, and are thus extremely disturbing.

Such N/2 ghosts essentially occur when the positive gradient pulse $G_{RO}^+$ differs slightly from the negative gradient pulse $G_{RO}^-$. The nuclear magnetic resonance signals read out under these gradient pulses will thus also be different, these being the measured values which are entered into the even and uneven row numbers of the raw data matrix M in alternation.

Figures 5, 6:
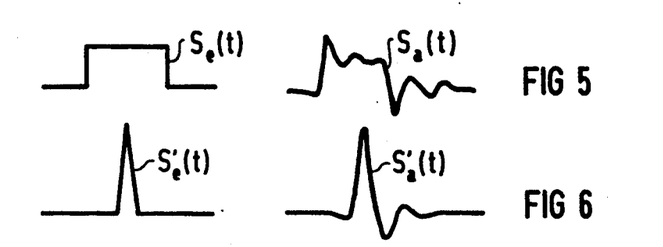
FIG. 5 shows filter input and output signals for a rectangular function of the type which commonly occur in conventional signal processing, leading to the formation of N/2 ghosts.
FIG. 6 shows filter input and output signals for a delta function of the type which commonly occur in conventional signal processing, which lead to the formation of N/2 ghosts.

The analog low-pass filtering which is always used in the signal editing can significantly contribute to the occurrence of these image artifacts. Every filter has overshoots in the time domain, which become more pronounced as the filter becomes steeper in the frequency range. A rectangular input signal $S_e(t)$ and the corresponding low-pass filtered output signal $S_a(t)$ are schematically shown in FIG. 5, and a delta function input signal $S'_e(t)$ and the corresponding low-pass filtered output signal $S'_a(t)$ are shown in FIG. 6. The respective input signals $S_e(t)$ and $S'_e(t)$ are distorted in the positive time direction as a consequence of the causality principle. In conventional imaging (for example, not based on the echo planar imaging method), this does not result in any significant image artifacts. The nuclear magnetic resonance signal in such conventional methods is read out under gradients having a uniform polarity, and the sampled signals are all entered into the rows of the raw data matrix M in the same direction. The distortion of the signals in positive and negative time directions therefore does not result in any noteworthy image artifacts.

In the echo planar imaging method, by contrast, the aforementioned N/2' ghosts arise because the sampled measured values are alternately written into the rows of the raw data matrix in the positive and in negative directions. With respect to the raw data matrix, the distortion therefore acts in alternation in the positive and negative directions.

Further image distortions are caused by inhomogeneities in the static magnetic field, as well as by non-linearities of the gradient fields.

Figure 7:
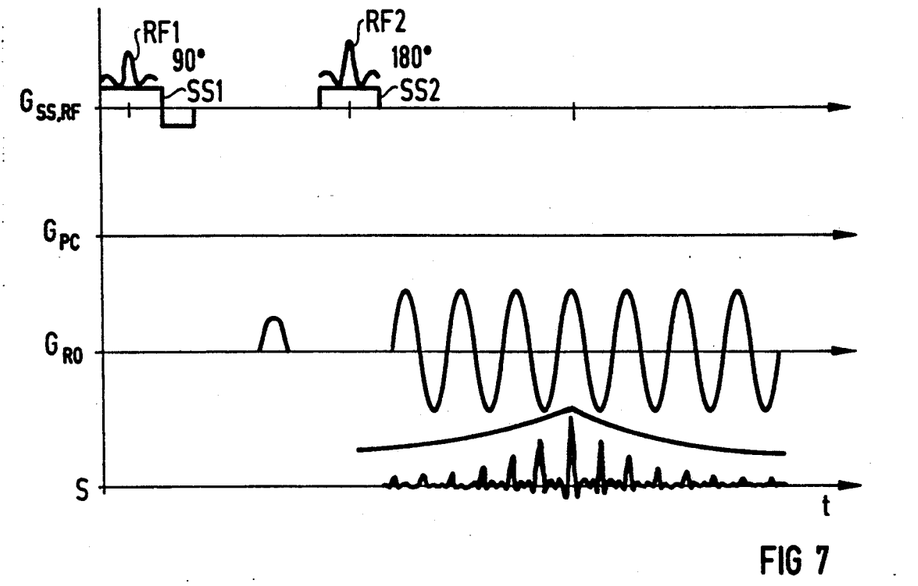
FIG. 7 shows signals which arise in a method according with the principles of the present invention for operating the magnetic resonance imaging apparatus of FIG. 1.

Exemplary embodiments of the method in accordance with the principles of the present invention are shown in detail with reference to FIGS. 7 through 10. All of these embodiments have in common the identification of system inadequacies (for example, fundamental magnetic field inhomogeneities, non-ideal low-frequency filters, deviation of the positive gradient from the negative gradient, gradient offset) with the assistance of an adjustment scan. An example of such an adjustment scan is shown in FIG. 7.

The adjustment scan shown in FIG. 7 basically corresponds to the EPI sequence of FIG. 2, but without the generation of a phase-coding gradient $G_{PC}$.

As in the normal EPI scan, the resulting signal is sampled, and the values acquired in this manner are entered into a row of a measurement matrix M per individual pulse of the read-out gradient $G_{RO}$. As a result of the different polarity of the gradient pulses $G_{RO}$, the data entry ensues in the aforementioned alternating directions.

Under ideal conditions, all echoes in the raw data matrix should be identical due to the absence of the phase-coding gradient $G_{PC}$. This does not apply in practice, however, and to the contrary the echoes will have different positions alternating from row to row. A smearing also occurs in the upper and lower rows of the data matrix upon read-out under a spin echo because of the inhomogeneity of the static field. This is shown in FIG. 8, which schematically shows the deviations from ideal conditions which occur in the raw data matrix J which is generated during the adjustment scan.

Figure 8:
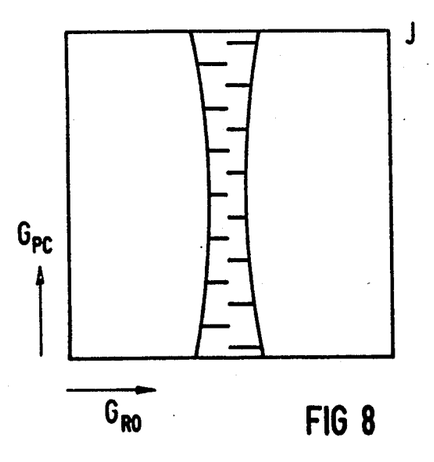
FIG. 8 is a schematic representation of a raw data matrix generated during the adjustment scan for linear correction in accordance with the principles of the present invention.
Figure 9:
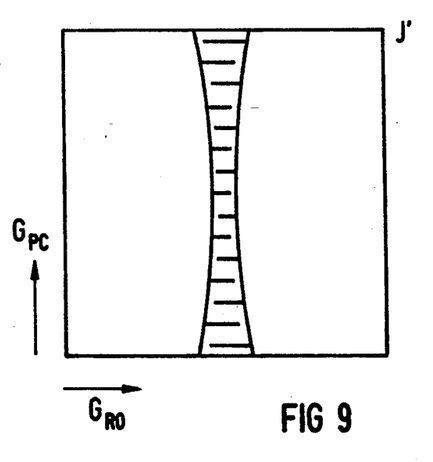
FIG. 9 is a schematic representation of a raw data matrix generated in a further embodiment of a method in accordance with the principles of the present invention.

A first possibility for correction using the adjustment scan is to undertake a linear phase correction. For the reasons already set forth, the echo position differs in practice given even and uneven rows. The shift in the k space is dependent on the respective row, and can be mathematically described as follows:

$$S_i^J(k) = S_i^J(k - \Delta k_1)$$

wherein the echo signal used to construct the image matrix J of FIG. 8 is referenced $S^J$, the echo signal used to construct a corrected image matrix J' (see FIG. 9) is referenced $S^{J'}$, the index i refers to the row number and $\Delta k_i$ represents the echo offset in the row i in the k space.

To calculate the echo offset $\Delta k_i$, the exact echo position must first be determined. This can ensue, for example, with a parabola fit.

The echo offset $\Delta k_i$ for each row i can thus be calculated from the adjustment scan. The raw data can now be corrected with these values. Let the raw data signal in the row i of the raw data matrix M be referenced $S_i^M(k)$. A one-dimensional Fourier transformation of the raw data matrix M is first undertaken in read-out direction, resulting in a signal $\tilde{S}_i^M(x)$, and indicated by the transformation $$S_i^M(k) \xrightarrow{\text{1D FFT}} \tilde{S}_i^M(x).$$

The signal $\tilde{S}_i^M(x)$ obtained in this manner is now locus-dependent with respect to x, with the tilde over the character indicating the locus space. This reference for signals in the locus space shall also be used in the following description. A linear phase correction of the measured signal can now be implemented using the values for the echo offset $\Delta k_i$ which were acquired from the adjustment scan, in accordance with the following relationship:

$$\overline{\tilde{S}}_i^M(x) = \tilde{S}_i^M(x) \cdot \exp(2\pi \Delta k_i x).$$

The corrected signal is thereby referenced $\overline{\tilde{S}}_i^M(X)$.

When another Fourier transformation is then undertaken in the phase-coding direction, an image matrix having linear phase correction is obtained.

Rather good values with respect to the echo positioning are achieved with this method, but only for the position of the central echo maximums. To demonstrate this, a matrix J' for the adjustment scan is shown in FIG. 9, the phase correction having been applied thereto. It can be seen that the echo maximums are identically positioned, but the neighboring points in the even and uneven rows continue to deviate from each another. This occurs due to phase distortions of a higher order which cannot be corrected using the linear phase correction. This results in N/2 ghosts continuing to arise in the image matrix, although with significantly diminished intensity.

A further reduction in image artifacts is achieved by undertaking a phase correction of a higher order, so that not only shifts, but also distortions of the echo signal S are taken into consideration. This can also be achieved using the above-described adjustment scan. The correction phase is calculated in the following way from the adjustment scan. The matrix J of the adjustment scan is first subjected to a one-dimensional Fourier transformation in the read-out direction, as schematically shown below:

$$S_i^J(k) \xrightarrow{1D\ FFT} \widetilde{S}_i^J(x) = |S_i^J|\exp(i\phi_i^J(x)).$$

The signal $\widetilde{S}_i^J(X)$ acquired in this manner is resolved into a magnitude $|S_i^J|$ and phase $\phi_i^J$. The phase relation $\phi_i^J(X)$ with respect to a reference phase is calculated from the adjustment scan. A correction phase $\phi_i^c(X)$ is then determined by the following relation:

$$\phi_i^c(X) = -\phi_i^J(X).$$

The phase $\phi_i^c(X)$ is now generally a non-linear function of the locus x.

The actual measured signal $S_i^M(X)$ is now phase-corrected in the following manner using the correction phase $\phi_i^c(X)$ as acquired above. First, a one-dimensional Fourier transformation is again implemented in read-out direction, schematically indicated as follows:

$$S_i^M(k) \xrightarrow{1D\ FFT} \widetilde{S}_i^M(x).$$

Subsequently, a phase correction is undertaken on the basis of the correction phase $\phi_i^c$, calculated as above, the phase correction being as follows:

$$\overline{S}_i^M(X) = \widetilde{S}_i^M(X) \cdot \exp(i\phi_i^c(X)).$$

The signal $\overline{S}_i^M(X)$ having a phase correction of a higher order is thus obtained. An image matrix is again obtained by subsequent Fourier transformation in the phasecoding direction. If the illustrated phase correction were applied to the adjustment scan itself, the echoes would be exactly positioned and the differences between the even and the uneven echoes would be less when compared with the illustration of FIG. 9. Image distortions in read-out direction are also reduced as an additional advantage.

In addition to the phase corrections which have been heretofore discussed, general filters can also be calculated from the adjustment data set in order, for example, to minimize the N/2 ghosts. A filter is set forth below which has the goal of adapting the shape of the even and the uneven echoes. The even and uneven echoes have different shapes due to the presence of an analog low-pass filter required in the measured value editing. This occurs due to distortions in the form of overshoots which the low-pass filter causes dependent on its steepness. These overshoots always follow a rapid signal change, i.e. they are directed in the positive time direction. Due to the alternating sorting of the measured values into the raw data matrix, however, the overshoots appear in alternation, and therefore lead to N/2 ghosts. This effect is intended to be minimized by the filter described below. These N/2 ghosts which, as described above are caused by differences between the positive half-pulses of the read-out gradient and the negative half-pulses of the read-out gradient are also largely eliminated.

The filtering proceeds on the basis of making even and uneven echoes, respectively identified below by the index g or u, identical. In the methods set forth above, an adjustment scan was first implemented and the adjustment data matrix J obtained by the adjustment scan was Fourier-transformed in read-out (x) direction. Subsequently, the following filter function F(x) is calculated from the signals of the uneven rows $\widetilde{S}^{Ju}(X)$ and the even rows $\widetilde{S}^{Jg}(X)$ according to the following:

$$F(x) = \frac{\widetilde{S}^{Ju}(x)}{\widetilde{S}^{Jg}(x)}.$$

This filter function F(x) is preferably calculated by averaging from the central rows of the adjustment data matrix J, Fourier-transformed in read-out direction.

For development of the transfer function, the raw data matrix M of the actual measured values is then similarly Fourier-transformed in the read-out (x) direction and even rows of the matrix obtained in this manner are multiplied by the filter function F(x). Corrected values $\widetilde{S}^{Mg'}(x)$ of the signals in the even rows are thus obtained. As shall be demonstrated below, the corrected signals of the even rows $\widetilde{S}^{g'}(x)$ thus becomes identical to the signal values in the uneven rows $\widetilde{S}^u(x)$. The ideal x x signal, i.e., the x signal identical for even and uneven rows of the raw data matrix, is referred to as S(x) for the following considerations. The even and uneven echoes $S^g$ and $S^u$ which are actually measured are described by a convolution operation of the ideal k signal S(k) with a point image that is different for even and uneven echoes, respectively referenced $P^g(k)$ and $P^u(k)$, as shown below:

$$S^u(k) = S(k) * P^u(k);$$

$$S^g(k) = S(k) * P^g(k).$$

As is known, the convolution can be converted into a product by a Fourier transformation as follows:

$$S(k)*P^u(k) \xrightarrow{1D\ FFT} S(x) \cdot P^u(x)$$

$$S(k)*P^g(k) \xrightarrow{1D\ FFT} S(x) \cdot P^g(x).$$

When the considerations presented above are now applied to the adjustment scan, the filter function F(x) can be represented as follows:

$$F(x) = \frac{\widetilde{S}^{Ju}(x)}{\widetilde{S}^{Jg}(x)}.$$

Because it can be assumed that the transfer function is identical for the adjustment scan and the measuring scan, the following is obtained after the aforementioned correction:

$$S^{g'}(x) = S^g(x) \cdot F(x) = S^u(x).$$

These signals are thus matched in even and uneven rows using this filter.

Figure 10:
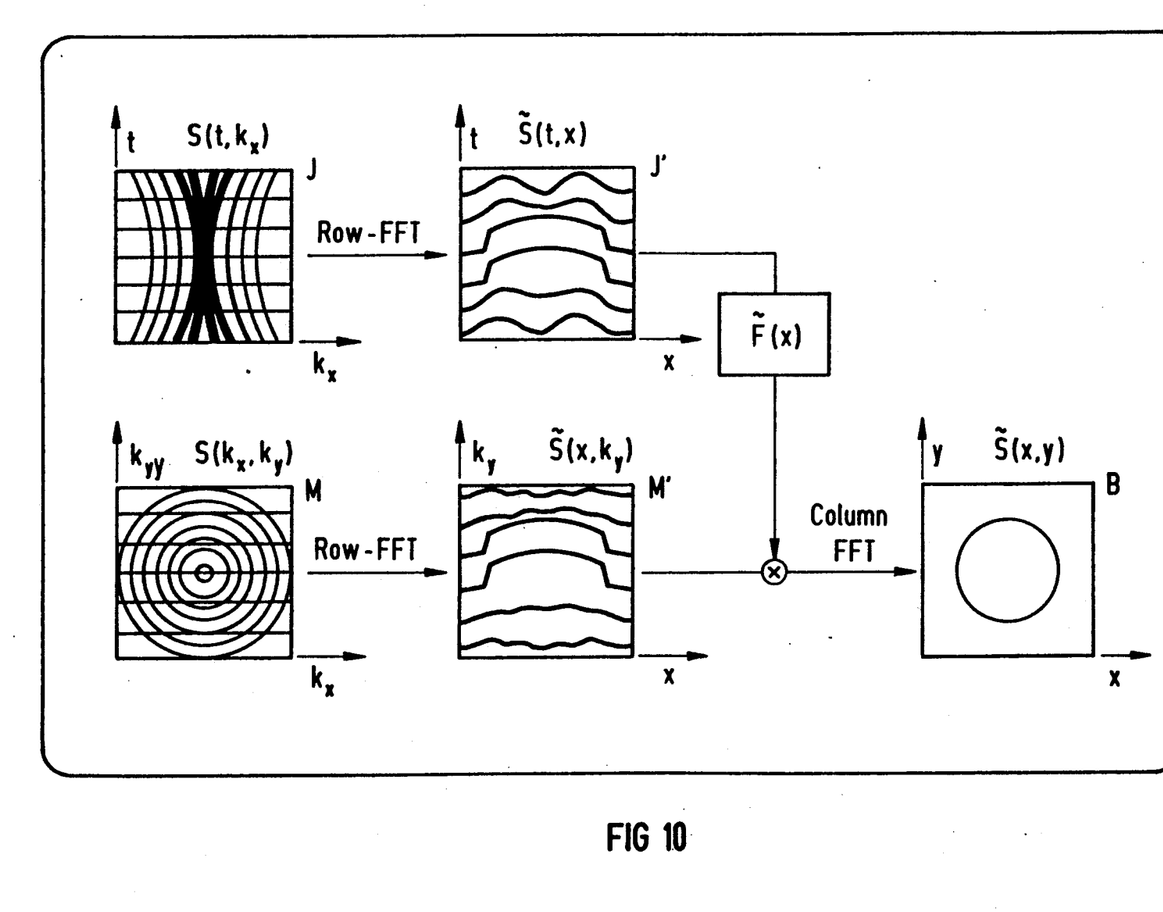
FIG. 10 is a schematic block diagram showing the method of filtering in accordance with the principles of the present invention.

The above-described filtering method is schematically shown in FIG. 10. The matrix J' is produced by Fourier transformation in the row direction from the raw data matrix J of the adjustment scan, wherein the distortions are expressed by the schematically illustrated curved lines, and the filter function F(x) is calculated therefrom. The matrix M' is formed by a Fourier transformation in the row direction of the raw data matrix M of the actual measured values. The corrected image B is obtained by multiplication of the filter function F(x) and the matrix M', and by a Fourier transformation in the column direction.

Development of the transfer function with respect to the static field inhomogeneity can also be implemented using a filter calculated from the adjustment data scan. The following filter function for the $i^{th}$ row is thereby calculated from the adjustment scan for each row of the matrix J of measured values, Fourier-transformed in the row direction, as follows:

$$F(x) = \frac{\widetilde{S}_R{}^J(x)}{\widetilde{S}_i{}^J(x)}.$$

The reference scan for that row of the adjustment data matrix at which the minimum de-phasing due to the fundamental field inhomogeneity occurs is referenced $\widetilde{S}^J{}_R(x)$. In the example of an EPI sequence shown in FIG. 2, wherein the measured signal and the envelope of a spin echo are read out, this is the row which coincides with the echo time TE. The maximum signal peak is reached at the echo time TE, and the corresponding signal is stored in the middle row of the raw data matrix. If the nuclear magnetic resonance signal is not read out under a spin echo, but is instead read out as a FID signal, the row of the raw data matrix corresponding to the first echo signal is employed as the reference row. As in the filter method set forth above, the raw data matrix M of the measured values is first Fourier-transformed in the row direction, and the corresponding filter function $F_i(x)$ is then applied to every row, so that the corrected measured values $\widetilde{S}^M{}_i(x)$ are obtained according to the following equation:

$$\widetilde{S}^M{}_i(x) = \widetilde{S}^M{}_i(x) \cdot F_i(x).$$

The influence of the static field inhomogeneity $\delta B_o$, which is identical for all rows i, is derived by applying the filter $F_i(x)$ as shown below.

The echoes become more distorted by the static field inhomogeneity $\delta B_o$ the farther they lie from the echo center of the spin echo (or from the first read-out echo of the FID signal). With reference to the adjustment scan, this can be described as follows:

$$S^J(t) = \int\int \widetilde{S}(x,y) \cdot \exp[i\gamma(G_{RO}xt + \delta B_o(x,y) \cdot t)] dx dy.$$

A quantity $S^P(x)$ is defined as follows (P standing for projection):

$$S^P(x) = \int \widetilde{S}(x,y) \cdot \exp[i\gamma \delta B_o(x,y) \cdot t] dy.$$

This means that:

$$S^J(t) = \int \widetilde{S}^P(x) \cdot \exp(i\gamma G_{RO}t) dx.$$

It is assumed for purpose of simplification below that the read-out gradient $G_{RO}$ is rectangular. This means that:

$$k = \gamma G_{RO} t.$$

$S^J(k)$ and $\widetilde{S}^P(x)$ can thus be represented as $$S^J(k) = \int \widetilde{S}^P(x) \cdot e^{ikx} dx;$$

$$\widetilde{S}^P(x) = \int \widetilde{S}(x,y) \exp(i\delta B_o(x,y) k / G_{RO}) dy.$$

Also defined is:

$$S^B(k) = F[\exp(i\delta B_o(x,y)k/G_{RO})].$$

The k space signal of the adjustment scan can be represented as the convolution of the ideal signal $S^P(k)$ with a part $S^B(k)$ of the static field inhomogeneity:

$$S^J(k) = S^P(k) * S^B(k).$$

After a one-dimensional Fourier transformation in the row direction, the convolution becomes the following product:

$$\widetilde{S}^J(x) = \widetilde{S}^P(x) \cdot \widetilde{S}^B(x).$$

For the $i^{th}$ row, this product is:

$$\widetilde{S}_i{}^J(x) = \widetilde{S}^P(x) \cdot \widetilde{S}_i{}^B(x).$$

When the above-designed filter function $F_i(x)$ is now applied to the adjustment data set itself, one can see that the static field inhomogeneity has the same influence on every row i:

$$\widetilde{S}^J{}_i(x) = \widetilde{S}^J{}_R(x).$$

After the application of this last-described method, which represents a development of the static field inhomogeneity, N/2 ghosts continue to be present. The reason for this is that the echo offset and distortions caused by the low-frequency filter are still present. These N/2 ghosts, however, can be substantially completely eliminated if, after the development of the static field inhomogeneity, the previously described development of the transfer function is also implemented. Good results with respect to the suppression of N/2 ghosts are also achieved by a combination of the non-linear phase correction and the development of the transfer function. For achieving the best results, the calculation of the development filter for the static field inhomogeneity should be implemented for a specific slice of a patient either preceding or following the image measurement scan.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for suppressing image artifacts in the generation of an image of an examination subject in a magnetic resonance imaging apparatus, comprising the steps of:
   (a) charging a region of an examination subject disposed in a static magnetic field with RF pulses thereby causing nuclear magnetic resonance signals to arise in said region of said examination subject;
   (b) generating a phase-coding gradient to phase code said NMR signals;
   (c) generating a read-out gradient in a read-out direction consisting of a plurality of pulses of alternating polarity;
   (d) sampling the nuclear magnetic resonance signals respectively read out during each pulse of read-out gradient to obtain raw data;

(e) successively entering the raw data obtained during each pulse of said read-out gradient in respective rows of a raw data matrix and alternating the direction of entry of said raw data in said rows dependent on the polarity of said pulses of said read-out gradient, steps (a) through (e) constituting a measurement scan;

(f) selectively preceding or following said measurement scan, conducting an adjustment scan of said examination subject consisting of steps (a), (c), (d) and (e) to obtain an adjustment scan matrix of data;

(g) identifying inadequacies in said data in said adjustment scan matrix and calculating correction data to minimize said inadequacies;

(h) conducting a first Fourier transform in said read-out direction of raw data in said raw data matrix and correcting said raw data using said correction data;

(i) conducting a second Fourier transform of the corrected data obtained in step (h) to generate an image matrix; and (j) generating an image of said region of said examination subject from said image matrix.

2. A method as claimed in claim 1 wherein steps (g), (h) and (i) are further defined by the steps of:
calculating the position in k space of the signal peaks in the rows of the adjustment data matrix;
for each row i of said adjustment data matrix, identifying any deviation in $\Delta k_i$ in the k space of the position of said signal peaks from a middle position in each row of said adjustment data matrix;
subjecting each row of the raw data matrix in k space to a Fourier transformation in the row direction, thereby obtaining a locus signal $\tilde{S}_i^M(x)$ for each row, wherein $x$ is a locus coordinate;
correcting the locus signals $\tilde{S}_i^M(x)$ with a phase correction factor $\exp(2\pi i \Delta k_i x)$; and
conducting a Fourier transformation of the signals $\tilde{S}_i^M(x)\cdot\exp(2\pi i \Delta k_i x)$ in the column direction.

3. A method as claimed in claim 1 wherein steps (g), (h) and (i) are further defined by the steps of:
conducting a Fourier transformation of said adjustment data matrix in the row direction to obtain a projection signal $\tilde{S}_i^J(x)$ in the locus space from an adjustment signal $S_i^J(k)$ in the k-space;
calculating a phase distortion $\phi_i$ of the projection signal based on the relationship $\tilde{S}_i^J(x) = |\tilde{S}_i^J| \exp(i\phi_i^J(x))$ and storing a correction phase $\phi_i^C(x) = -\phi_i^J(x)$;
subjecting each row of said raw data matrix to a Fourier transformation in the row direction, thereby obtaining a locus signal $\tilde{S}_i^M(x)$;
subjecting said locus signal $\tilde{S}_i^M(x)$ to a phase correction with the correction phase $\phi_i^C(x)$, thereby obtaining a phase-corrected signal $\tilde{S}_i^M(x)\cdot\exp(i\phi_i^C(x))$; and
conducting a Fourier transformation in the column direction of the raw data matrix which has been subject to said Fourier transformation in the row direction and which has said phase-corrected signals, thereby obtaining a phase-corrected image matrix.

4. A method as claimed in claim 1 wherein steps (g), (h) and (i) are further defined by the steps of:
conducting a Fourier transformation of said adjustment data matrix in the row direction to obtain a projection signal $\tilde{S}_i^J(x)$ in the locus space from an adjustment signal $S_i^J(k)$ in the k space;
calculating a filter function $$F(x) = \frac{\tilde{S}_i^{Ju}(x)}{\tilde{S}_i^{Jg}(x)}$$

from the signals $\tilde{S}_i^{Ju}(x)$ of the uneven rows of a matrix J' and from the signals $\tilde{S}_i^{Jg}(x)$ of the even rows of the matrix J';
conducting a Fourier transformation of each row of the raw data matrix in the row direction, thereby obtaining a locus signal $\tilde{S}_i^M(x)$ and a matrix M';
filtering the even rows of the matrix M' with the filter function $F_i(x)$ wherein i is the row index; and
conducting a Fourier transformation in the column direction of the matrix M' whose even rows have been filtered with the filter function $F_i(x)$, thereby obtaining a corrected image matrix.

5. A method as claimed in claim 4 wherein the step of calculating said filter function is further defined by calculating the filter function $F(x)$ by averaging from central rows of the matrix J'.

6. A method as claimed in claim 1 wherein the steps (g), (h) and (i) are further defined by the steps of:
conducting a Fourier transformation in the row direction of said adjustment data matrix to obtain a projection signal $\tilde{S}_i^J(x)$ in the locus space from an adjustment signal $S_i^J(k)$ in the k space, and thereby obtaining a matrix J';
selecting a reference row R from the matrix J' consisting of the signal $\tilde{S}_R^J(x)$ at which an echo maximum occurs;
for each row i of the matrix J', calculating a filter function $$F(x) = \frac{\tilde{S}_R^J(x)}{\tilde{S}_i^J(x)};$$

conducting a Fourier transformation in the row direction of every row of the raw data matrix, thereby obtaining a locus signal $\tilde{S}_i^M(x)$;
filtering all rows of the matrix obtained by subjecting said raw data matrix to the Fourier transformation in the row direction by the filter function $F_i(x)$ to obtain a further matrix; and
conducting a Fourier transformation in the column direction of said further matrix, thereby obtaining a corrected image matrix.

* * * * *